United States Patent [19]
Chu et al.

[11] Patent Number: 5,902,707
[45] Date of Patent: May 11, 1999

[54] MASK CONTAINING ALIGNMENT MARK PROTECTION PATTERN

[75] Inventors: Tsu-Yu Chu; Jui-Yu Chang, both of Tao-Yuan; Kun-Pi Cheng, Hsin-Chu, all of Taiwan

[73] Assignee: Taiwan Semiconductor Manufacturing Company, Ltd., Hsin-Chu, Taiwan

[21] Appl. No.: 09/118,035

[22] Filed: Jul. 17, 1998

Related U.S. Application Data

[62] Division of application No. 08/901,168, Jul. 28, 1997.

[51] Int. Cl.$^6$ .................................................. G03F 9/00
[52] U.S. Cl. .............................................. 430/5; 430/22
[58] Field of Search ............................................ 430/5, 22

[56] References Cited

U.S. PATENT DOCUMENTS 5,456,756  10/1995  Ramaswami et al. .................. 118/721
5,503,962  4/1996  Caldwell .................................. 430/317

*Primary Examiner*—Christopher G. Young
*Attorney, Agent, or Firm*—George O. Saile; Stephen B. Ackerman; Larry J. Prescott

[57] ABSTRACT

A mask, which does not require additional reticles, and a method of using the mask for recovering alignment marks in a wafer after an inter-level dielectric layer has been planarized and a second layer of metal has been deposited on the planarized inter-level dielectric layer are described. An alignment mark protection pattern and a clearout window pattern are sub-divided so they can be formed from a first and a second mask element. These mask elements can be formed in the peripheral region of the reticle used to pattern the device region of the wafer. The mask elements are used to expose the alignment mark protection pattern in a first layer of photoresist and the clearout window pattern in a second layer of photoresist.

8 Claims, 6 Drawing Sheets

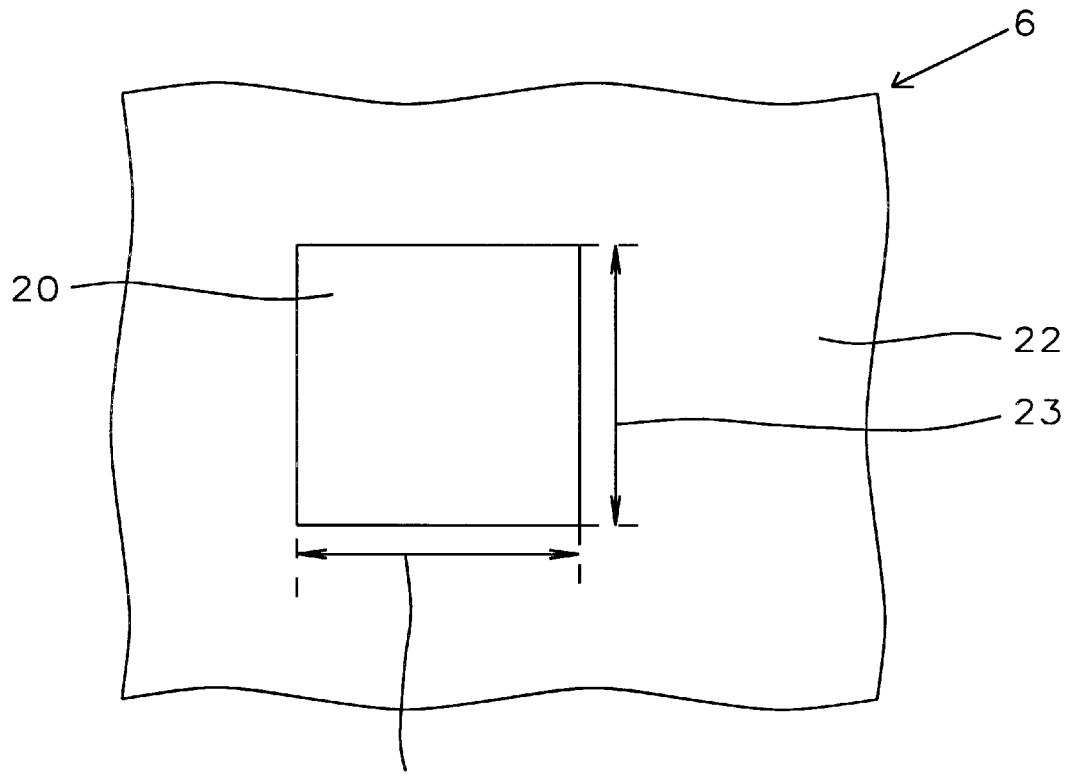
FIG. 4 - Prior Art
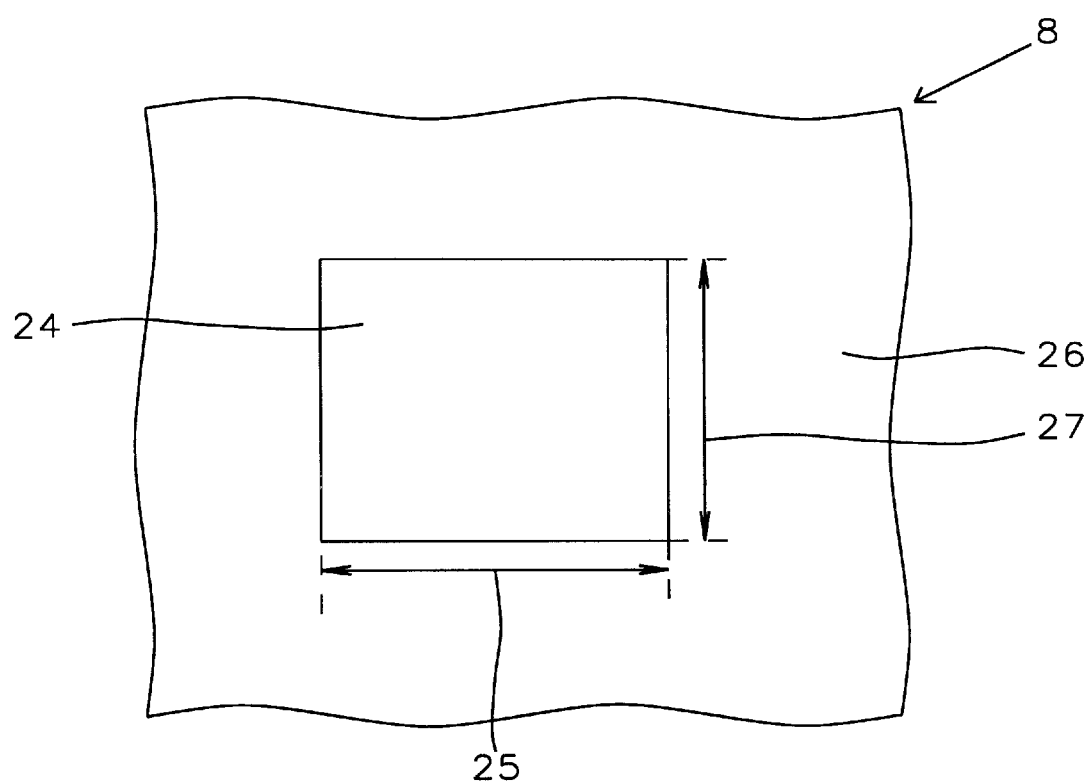
FIG. 5 - Prior Art

MASK CONTAINING ALIGNMENT MARK PROTECTION PATTERN

RELATED PATENT APPLICATION

This is a division of patent application Ser. No. 08/901,168, filing date Jul. 28, 1997, Use Of Sub Divided Pattern For Alignment Mark Recovery After Inter-Level Dielectric Planarization, assigned to the same assignee as the present invention.

(TSMC-96-163), Ser. No. 08/850,133, Filed May 1, 1997, entitled "A Mask Pattern and Method For Recovering Alignment Marks After Chemical Mechanical Polishing," assigned to the same assignee.

BACKGROUND OF THE INVENTION

(1) Field of the Invention

This invention relates to masks and methods used for alignment mark recovery after chemical mechanical polishing of an inter-level dielectric, and more particularly to masks and methods for using the masks which do not require additional reticles.

(2) Description of the Related Art

U.S. Pat. No. 5,456,756 to Ramaswami et al. describes a method of protecting alignment marks by using a metal cover over the marks to prevent metal from depositing over the marks on planarized wafers.

U.S. Pat. No. 5,503,962 to Caldwell describes a method of forming additional alignment marks by forming an opening in a planarized inter-level dielectric layer. A conductive material comprising tungsten, having a thickness less than the inter-level dielectric layer, is then deposited in the opening. Chemical Mechanical Polishing is then used to remove the conducting material other than the conducting material in the opening, thereby forming a new alignment mark.

The present invention describes a mask and method for forming a mask protection pattern and a clearout window to recover alignment marks. The mask of this invention is formed from mask elements located in the peripheral region of reticles used to pattern the device regions of a wafer and does not require separate reticles.

SUMMARY OF THE INVENTION

The manufacture of integrated circuit wafers requires a number of serial photolithographic steps. The various masks used in these steps must be aligned to the same reference point. Alignment marks formed in the wafer usually serve this purpose. These alignment marks usually have a step height which can be detected optically for either manual or automatic alignment of masks. If these alignment marks are covered by a transparent material or by a material which conforms to the topography of the underlying layer, thereby preserving the step height of the alignment marks, the alignment of the masks can still be readily accomplished. FIG. 1 shows a cross section of the alignment region of an integrated circuit wafer 10 with a layer of oxide 12 and a first layer of conducting material 14, such as polysilicon, formed thereon. The alignment marks 40 are transferred to the first layer of conducting material and can be readily detected.

Frequently in the manufacture of these integrated circuit wafers an inter-level dielectric 16, is formed over the first layer of conducting material 14, see FIG. 2, so that the alignment marks 40 are still detectable. However, as shown in FIG. 3, the inter-level dielectric 16 is then planarized, using a method such as chemical mechanical polishing, and a second layer of conducting material 18 is deposited on the planarized inter-level dielectric 16 and the usefulness of the alignment marks is lost making further mask alignment impossible.

This problem is conventionally solved using the masks shown in FIGS. 4 and 5. FIG. 4 shows a part of a first mask 6 having an alignment mark protection pattern 20. The alignment mark protection pattern 20 is rectangular and has a length 21 and a width 23. FIG. 5 shows a part of a second mask 26 having a clearout window pattern 24. The clearout window pattern 24 is also rectangular and has a length 25 and a width 27.

FIG. 6 again shows the cross section of the alignment region of an integrated circuit wafer 10 with a layer of oxide 12 and a first layer of conducting material 14, such as polysilicon, formed thereon. A first photoresist mask 30 is formed on the first layer of conducting material covering the alignment marks 40 using the alignment mark protection pattern 20 of the first mask 6. If positive photoresist is used to form the first photoresist mask 30 the alignment mark protection pattern 20 is opaque and the surrounding region 22 is transparent, see FIG. 4. If negative photoresist is used to form the first photoresist mask 30 the alignment mark protection pattern 20 is transparent and the surrounding region 22 is opaque, see FIG. 4.

As shown in FIG. 7, that part of the first layer of conducting material 14 not covered by the first photoresist mask is etched away and the first photoresist mask is stripped. As can be seen in FIG. 7 the alignment marks 40 can still be detected. As shown in FIG. 8, a layer of inter-level dielectric 16 is then formed over the wafer 10. As shown in FIG. 9, the inter-level dielectric 16 is then planarized using a method such as chemical mechanical polishing. As shown in FIG. 10, a second photoresist mask 32 is formed over the planarized inter-level dielectric layer 16 using the clearout window pattern 24 of the second mask 80. If positive photoresist is used to form the second photoresist mask 32 the clearout window pattern 24 is transparent and the surrounding region 26 is opaque, see FIG. 5. If negative photoresist is used to form the second photoresist mask 32 the clearout window pattern 24 is opaque and the surrounding region 26 is transparent, see FIG. 5.

Next, as shown in FIG. 11 that part of the inter-level dielectric layer not covered by the second photoresist mask is etched away and the second photoresist mask is stripped. As shown in FIG. 12, the second layer of conducting material 18 is then formed and the alignment marks 40 are preserved for future mask alignment.

One of the problems with the mask and methods just described is that a reticle separate from those used to form the device regions of the wafer is required to form the alignment mark protection pattern and the clearout window pattern, resulting in extra cost and extra processing.

It is a principle objective of this invention to provide mask segments formed in the peripheral region of the reticles used to form the device regions of a wafer which can be used to form the alignment mark protection pattern and the clearout window pattern used to preserve alignment marks in the wafer.

It is a further principle objective of this invention to provide a method of preserving alignment marks in a wafer using mask segments formed in the peripheral region of the reticles used to form the device regions of the wafer.

These objectives are achieved by dividing the alignment mark protection pattern and the clearout window pattern into mask segments which will fit into the peripheral region of the reticles used to form the device regions of the wafer. These segments can then be exposed sequentially to form the alignment mark protection pattern and the clearout window pattern required to preserve the alignment marks.

BRIEF DESCRIPTION OF THE DRAWINGS

FIG. 4 shows a conventional mask for forming the alignment mark protection pattern.

FIG. 5 shows a conventional mask for forming the clearout window pattern.

DESCRIPTION OF THE PREFERRED EMBODIMENTS

Figure 13:
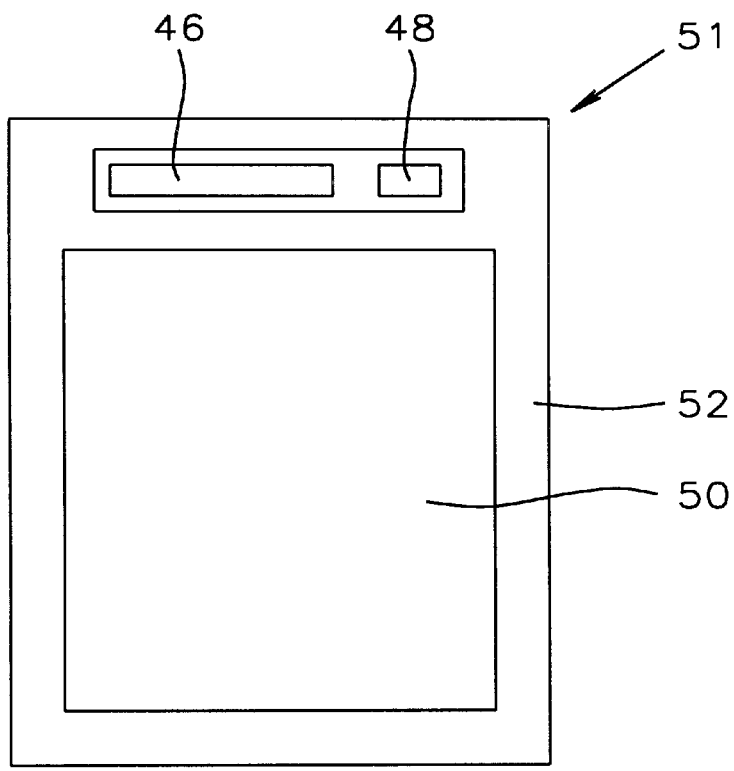
FIG. 13 shows a top view of a reticle with a device region and a peripheral region in which the mask segments of this invention are formed.

Refer now to FIGS. 13–16 for a description of the preferred embodiment of the mask of this invention. FIG. 13 shows a top view of a reticle 51 used in the photolithographic processing of integrated circuit wafers. The reticle 51 has a device region 50, in which the device pattern is formed, and a peripheral region 52. A first mask element 46 and a second mask element 48 are formed in the peripheral region 52 of the reticle. The first mask element 46 and the second mask element 48 can be opaque surrounded by a transparent region or transparent surrounded by an opaque region depending on whether they are used to expose positive or negative photoresist, as will be explained in more detail later.

Figure 14:
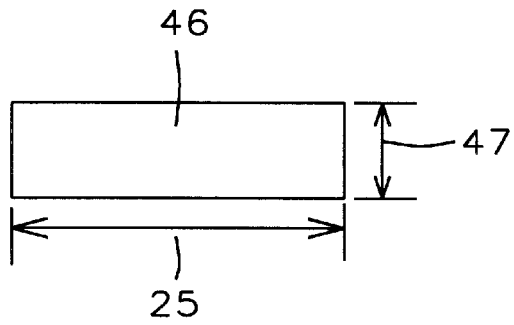
FIG. 14 shows a diagram of the first mask segment.
Figure 15:
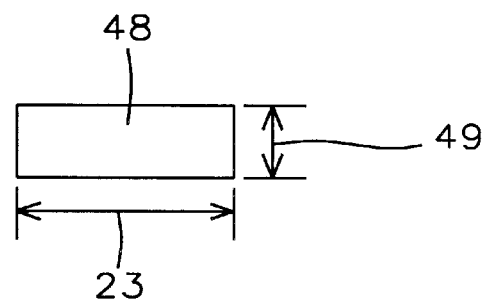
FIG. 15 shows a diagram of the second mask segment.

FIG. 14 shows a diagram of the first mask element 46 which has a length 25 equal to the length of the clearout window pattern and a width 47. FIG. 15 shows a diagram of the second mask element 48 which has a width 23 equal to the width of the alignment mark protection pattern and a length 49.

Figure 16:
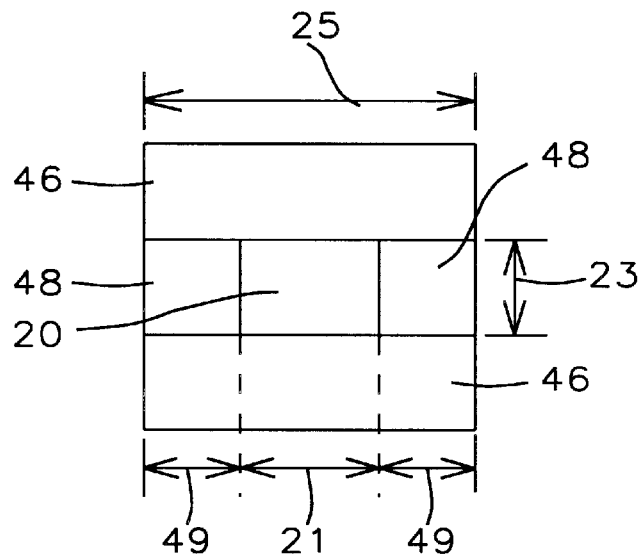
FIG. 16 shows a diagram of how the first mask segments and second mask segments are combined to form the alignment mark protection pattern.

FIG. 16 shows how two exposures of the first mask element 46 and two exposures of the second mask element 48 can be used to form the alignment mark protection pattern 20, reference number 20 in FIG. 4, in a layer of photoresist. The width 23 of the second mask element 48 is equal to the width 23 of the alignment mark protection pattern 20. The length 49 of the second mask element 49 is equal to one half of the length of the alignment mark protection pattern 21 subtracted from one half of the length of the clearout window pattern 25. The first mask element 46 and the second mask element 48 will be transparent if they are used to expose positive photoresist and opaque if they are used to expose negative photoresist.

Figure 17:
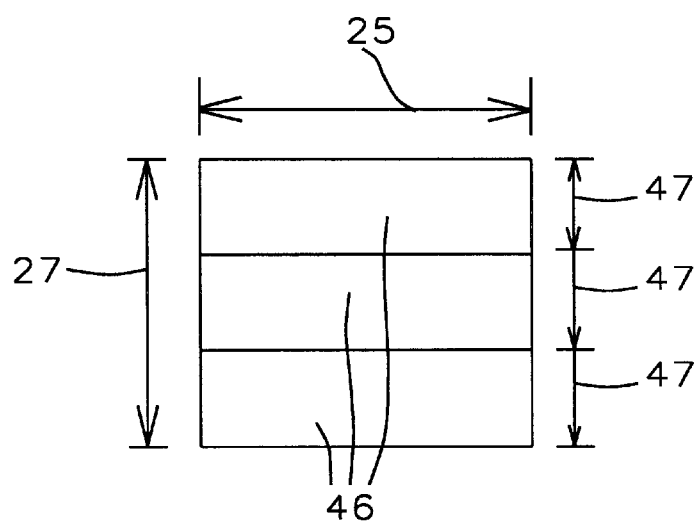
FIG. 17 shows a diagram of how first mask segments are combined to form the clearout window pattern.

FIG. 17 shows how three exposures of the first mask element 46 can be used to form the clearout window pattern, reference number 24 in FIG. 5, in a layer of photoresist. The length 25 of the first mask element 46 is equal to the length 25 of the clearout window pattern. The width 47 of the first mask element 46 is equal to one third of the width 27 of the clearout window pattern. The first mask element 46 will be transparent if it is used to expose positive photoresist and opaque if it is used to expose negative photoresist.

The length and width of the alignment mark protection pattern, the clearout window pattern, the first mask element, and the second mask element depend upon the chip size.

Figure 1:
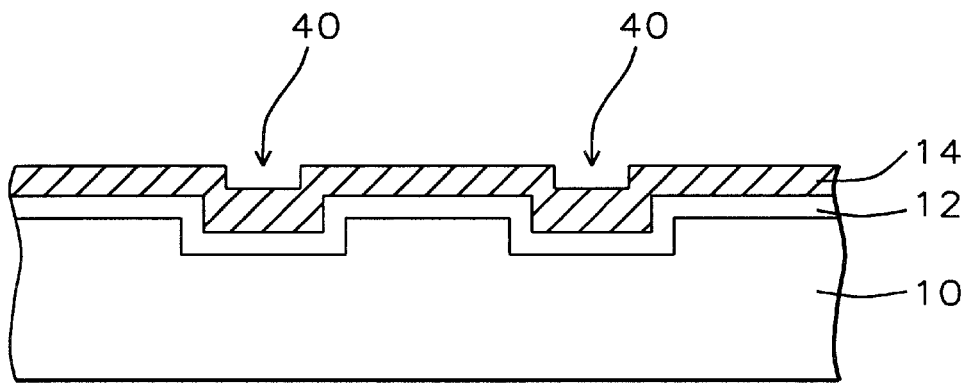
FIG. 1 shows a cross section view of an alignment region of a wafer after a first layer of conducting material has been formed.
Figure 2:
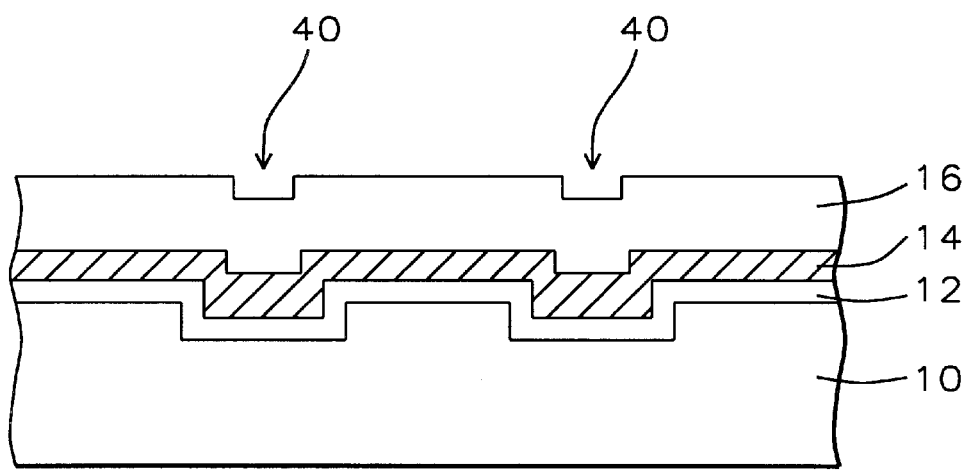
FIG. 2 shows a cross section view of an alignment region of a wafer after an inter-level dielectric layer has been formed.
Figure 3:
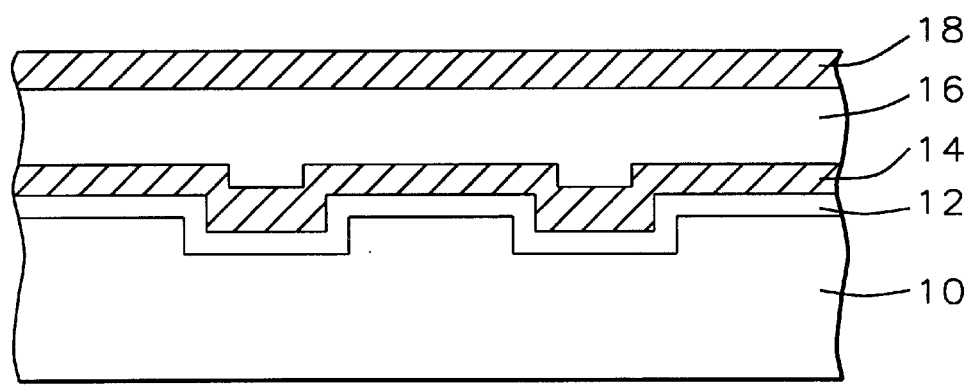
FIG. 3 shows a cross section view of an alignment region of a wafer after the inter-level dielectric has been planarized and a second layer of conducting material has been formed.

Refer now to FIGS. 1 and 6–17 for a description of the preferred embodiment of the method of preserving alignment marks in a wafer using the first mask segment and second mask segment formed in the peripheral region of the reticles used to form the device regions of the wafer. FIG. 1 shows a cross section view of a part of the alignment region of a substrate, such as an integrated circuit wafer, after a dielectric layer 12 and a first layer of conductor material 14, such as polysilicon having a thickness of between about 2000 and 4000 Angstroms, have been formed on the wafer. The device region of the wafer is not shown but will also have the dielectric layer 12 and the first layer of conductor material 14. The first layer of conductor material 14 retains the alignment marks 40.

Figure 6:
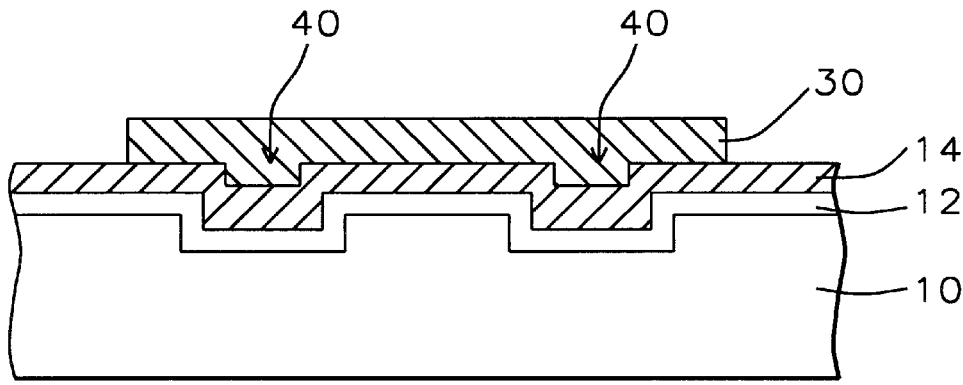
FIG. 6 shows a cross section view of an alignment region of a wafer after the alignment mark protection pattern has been transferred to a first photoresist mask.

Next, as shown in FIG. 6, a first photoresist mask 30 is formed over the first layer of conductor material 14. The first photoresist mask 30 covers the alignment marks 40 and is formed to the alignment mark protection pattern shown in FIG. 4. The first photoresist mask is formed using the first mask element 46 and the second mask element 48 in the peripheral region 52 of the same reticle 51 used for patterning the first layer of conductor material in the device region of the wafer with the device pattern in the device region 50 of the reticle 51, see FIG. 13.

The first photoresist mask is formed using two exposures of a first layer of photoresist with the first mask element 46 and two exposures of the first layer of photoresist with the second mask element 48, as shown in FIG. 16. The first mask element 46 and the second mask element 48 form a border around the alignment mark protection pattern 20. The width 23 of the second mask element 48 is equal to the width 23 of the alignment mark protection pattern 20. The length 49 of the second mask element 48 is equal to one half of the length 21 of the alignment mark protection pattern 20 subtracted from one half of the length 25 of the clearout window pattern. The first mask element 46 and the second mask element 48 will be transparent if they are used to expose positive photoresist and opaque if they are used to expose negative photoresist. The photoresist overlaying the device region of the wafer is exposed using the device pattern in the device region of the reticle to form a first device pattern mask.

Figure 7:
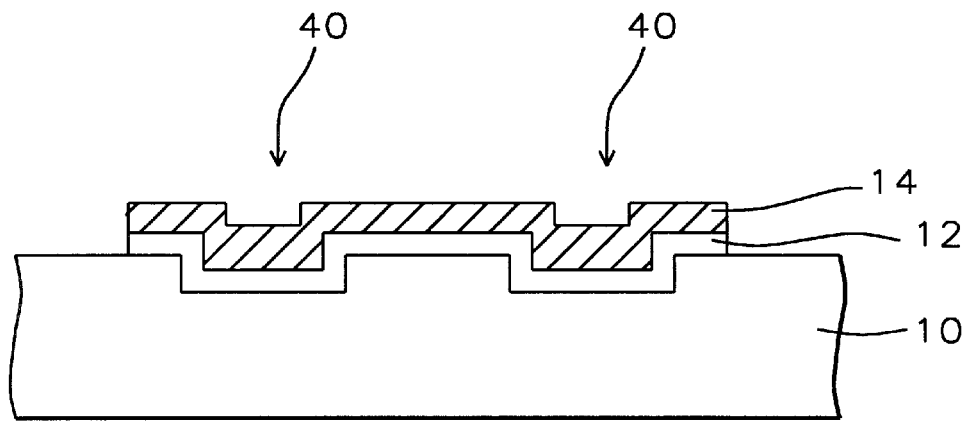
FIG. 7 shows a cross section view of an alignment region of a wafer after that part of the first layer of conducting material not covered by the first photoresist mask has been etched away and the first photoresist mask has been removed.
Figure 8:
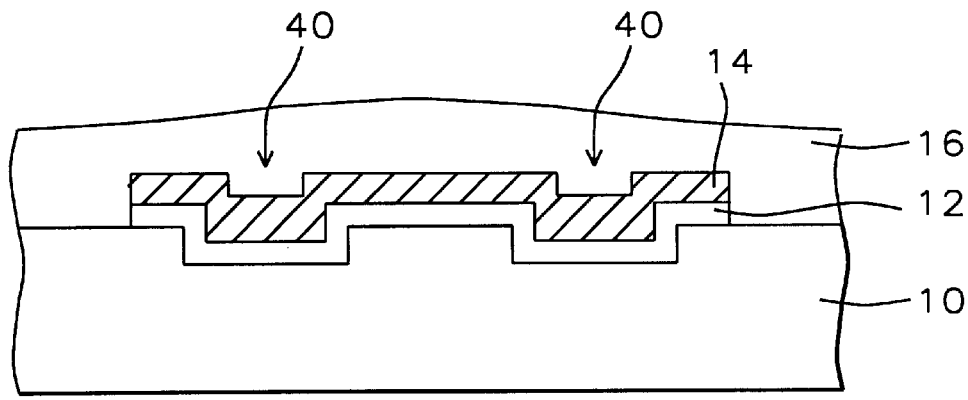
FIG. 8 shows a cross section view of an alignment region of a wafer after a layer of inter-level dielectric has been formed.
Figure 9:
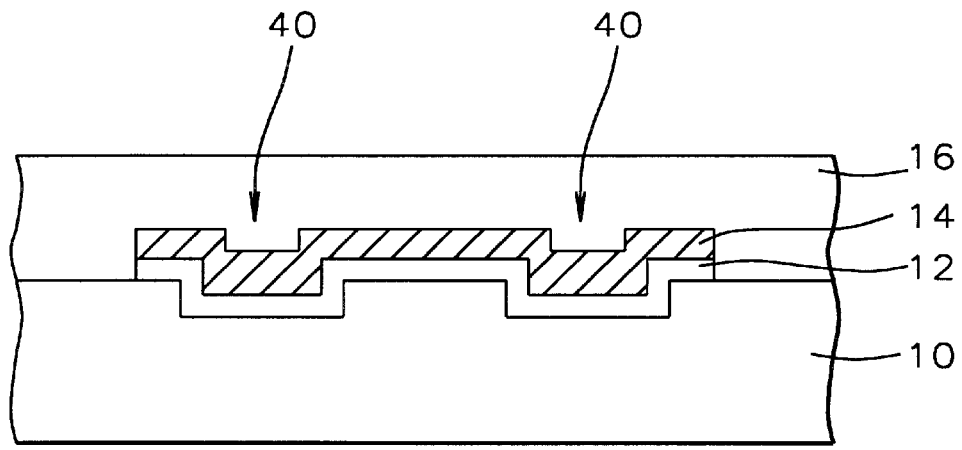
FIG. 9 shows a cross section view of an alignment region of a wafer after the layer of inter-level dielectric has been planarized.

Next, as shown in FIG. 7, that part of the first layer of conductor material not covered by the first photoresist mask or the first device pattern mask is etched away. This forms the conductor material pattern in the device region of the wafer and transfers the alignment mark protection pattern to the first layer of conduction material in the alignment region of the wafer. As can be seen in FIG. 7, the alignment marks 40 are can still be detected. As shown in FIG. 8, a layer of inter-metal dielectric 16, such as silicon oxide having a thickness of between about 10000 and 20000 Angstroms. As shown in FIG. 9, the layer of inter-level dielectric 16 is then planarized using a method such as chemical mechanical polishing. The alignment marks 40 can still be detected through the silicon oxide.

Figure 10:
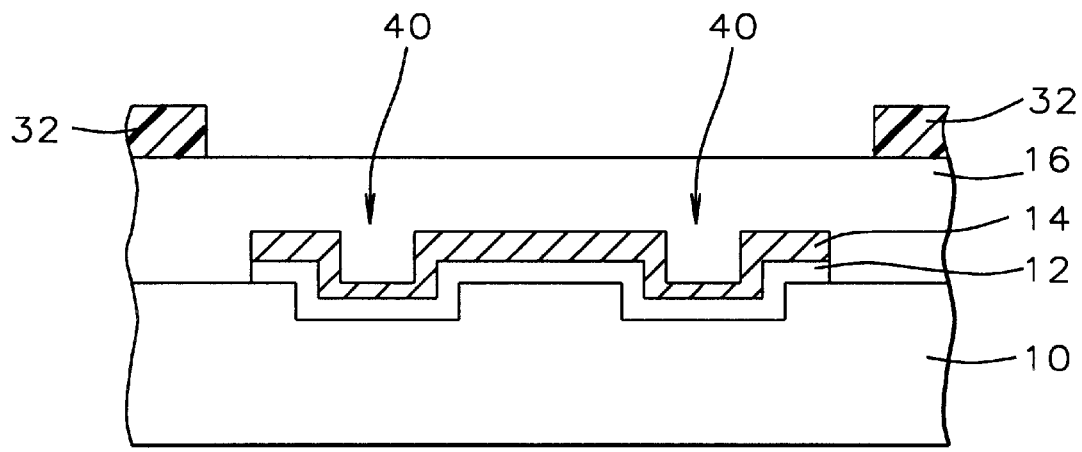
FIG. 10 shows a cross section view of an alignment region of a wafer after the clearout window pattern has been transferred to a second photoresist mask on the planarized inter-level dielectric.

Next, as shown in FIG. 10, a second photoresist mask 32 is formed over the planarized layer of inter-level dielectric 16. The second photoresist mask 32 defines the clearout window and is formed to the clearout window pattern 24 shown in FIG. 5. The second photoresist mask is formed using the first mask element 46 in the peripheral region 52 of the same reticle 51 used for forming the inter-level via holes in the inter-level dielectric in the device region of the wafer with the device pattern in the device region 50 of the reticle 51, see FIG. 13.

The second photoresist mask is formed using three exposures of a second layer of photoresist with the first mask element 46, as shown in FIG. 17. The length 25 of the first mask element 46 is equal to the length 25 of the clearout window pattern. The width 47 of the first mask element 46 is equal to one third of the width 27 of the clearout window pattern. The first mask element 46 will be transparent if it is used to expose positive photoresist and opaque if it is used to expose negative photoresist. The photoresist overlaying the device region of the wafer is exposed using the device pattern in the device region of the reticle to form a second device pattern mask for forming inter-level vias in the inter-level dielectric.

Figure 11:
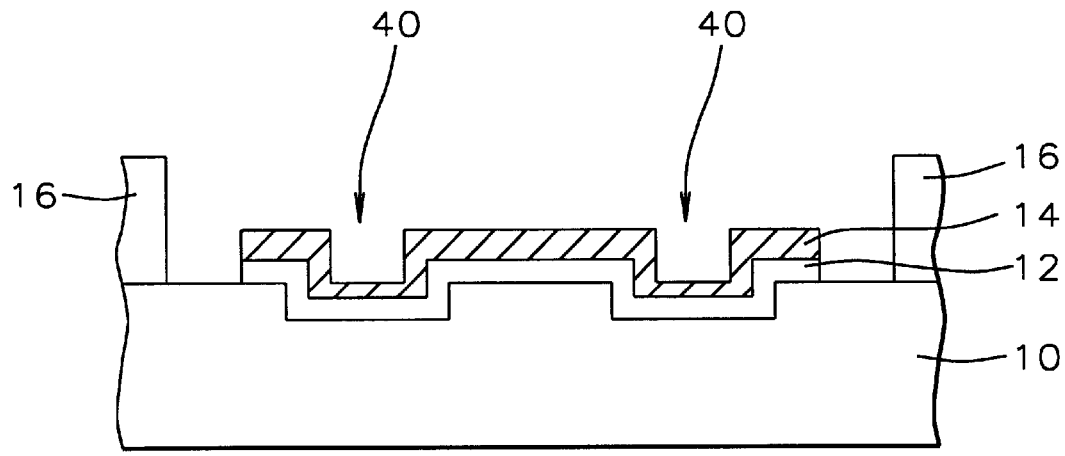
FIG. 11 shows a cross section view of an alignment region of a wafer after the clearout window has been etched into the planarized inter-level dielectric layer.
Figure 12:
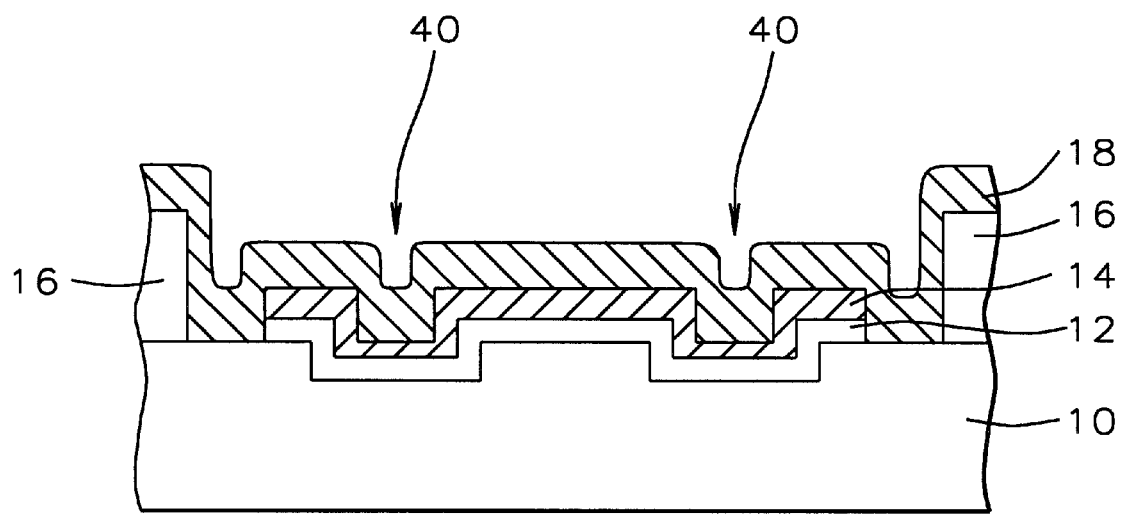
FIG. 12 shows a cross section view of an alignment region of a wafer after the clearout window has been etched into the planarized inter-level dielectric layer and a second layer of conductor material has been deposited on the wafer.

Next, as shown in FIG. 11, that part of the layer of inter-level dielectric not covered by the second photoresist mask or the second device pattern mask is etched away forming a clearout window in the alignment region of the wafer at the same time via holes are formed in the device region of the wafer. Next, as shown in FIG. 12, a layer of second conductor material 18, such as aluminum copper and titanium nitride having a thickness of between about 4500 and 7500 Angstroms is formed on the wafer. because of the alignment mark protection pattern formed in the first layer of conductor material and the formation of the clearout window the alignment marks 40 are still detectable. The second layer of conductor material can now be patterned and processing of the wafer continued.

While the invention has been particularly shown and described with reference to the preferred embodiments thereof, it will be understood by those skilled in the art that various changes in form and details may be made without departing from the spirit and scope of the invention.

What is claimed is:

1. A mask, comprising:

a device region having a device pattern;

a peripheral region adjacent to and external to said device region;

a first mask element formed in said peripheral region wherein said first mask element can be used to form a clearout window pattern; and a second mask element formed in said peripheral region wherein said second mask element can be used in combination with said first mask element to form an alignment mark protection pattern.

2. The mask of claim 1 wherein said first mask element, said second mask element, said clearout window pattern, and said alignment mark protection pattern are rectangles, each said rectangle having a length and a width.

3. The mask of claim 1 wherein said first mask element and said second mask element are opaque.

4. The mask of claim 1 wherein said first mask element and said second mask element are transparent.

5. The mask of claim 2 wherein said length of said clearout window pattern is equal to said length of said first mask element.

6. The mask of claim 2 wherein said width of said clearout window pattern is equal to three times said width of said first mask element.

7. The mask of claim 2 wherein said width of said alignment mark protection pattern is equal to said width of said second mask element.

8. The mask of claim 2 wherein said length of said alignment mark protection pattern is equal to two times said width of said second mask element subtracted from said length of said clearout window pattern.

* * * * *